(12) United States Patent
Tan et al.

(10) Patent No.: US 7,836,420 B2
(45) Date of Patent: Nov. 16, 2010

(54) INTEGRATED CIRCUIT SYSTEM WITH ASSIST FEATURE

(75) Inventors: Sia Kim Tan, Singapore (SG); Qunying Lin, Singapore (SG); Andrew Khoh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 426 days.

(21) Appl. No.: 11/876,663

(22) Filed: Oct. 22, 2007

(65) Prior Publication Data
US 2009/0102069 A1   Apr. 23, 2009

(51) Int. Cl.
G06F 17/50 (2006.01)
G06F 19/00 (2006.01)
H01L 25/00 (2006.01)
H01L 23/48 (2006.01)
H01L 21/82 (2006.01)

(52) U.S. Cl. .............. 716/8; 716/21; 700/120; 700/121; 326/47; 326/101; 257/773; 438/129

(58) Field of Classification Search ........ 716/8, 716/21; 700/120, 121; 326/47, 101; 438/129; 257/773
See application file for complete search history.

(56) References Cited

U.S. PATENT DOCUMENTS

| 6,852,454 | B2 | 2/2005 | Mancini et al. | |
|---|---|---|---|---|
| 7,083,880 | B2 | 8/2006 | Talin et al. | |
| 7,538,438 | B2* | 5/2009 | Yu et al. | 257/773 |
| 2002/0061608 | A1* | 5/2002 | Kuroda et al. | 438/129 |
| 2006/0248495 | A1 | 11/2006 | Sezginer | |
| 2006/0248496 | A1 | 11/2006 | Sezginer et al. | |
| 2006/0248499 | A1 | 11/2006 | Sezginer et al. | |
| 2006/0278875 | A1 | 12/2006 | Ohnuma et al. | |
| 2007/0004097 | A1* | 1/2007 | Yu et al. | 438/129 |

* cited by examiner

*Primary Examiner*—Phallaka Kik
(74) *Attorney, Agent, or Firm*—Mikio Ishimaru

(57) ABSTRACT

An integrated circuit system comprising: providing a substrate; forming a main feature using a first non-cross-junction assist feature over the substrate; forming the main feature using a second non-cross-junction assist feature, adjacent a location of the first non-cross-junction feature, over the substrate; and forming an integrated circuit having the substrate with the main feature thereover.

20 Claims, 3 Drawing Sheets

INTEGRATED CIRCUIT SYSTEM WITH ASSIST FEATURE

TECHNICAL FIELD

The present invention relates generally to integrated circuit and more particularly to a system for integrated circuits with assist features.

BACKGROUND ART

Integrated circuits have become ubiquitous in many portable electronic products, such as cell phones, portable computers, voice recorders, etc. as well as in many larger electronic systems, such as cars, planes, industrial control systems, etc. Across all applications, there continues to be demand for reducing the size and increasing performance of the devices.

Virtually all electronic products benefit from increasing functions and performance in integrated circuit chips while being designed into ever-smaller physical space. These demands are often very visible with the many consumer electronic products including but not limited to personal portable devices, such as cellular phones, digital cameras, and music players.

Thus, there is a constant drive within the semiconductor industry to reduce sizes as well as increase quality, reliability, and throughput of integrated circuit devices, e.g., microprocessors, memory devices, and the like. This drive is fueled by consumer demands for smaller, higher quality computers and electronic devices that operate more reliably.

These demands have resulted in continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

Among the parameters that would be useful to monitor and control are critical dimensions as well as overlay errors in photolithography. Critical dimensions are the smallest feature sizes that particular processing devices may be capable of producing. For example, the minimum widths of polysilicon or poly gate lines for metal-oxide semiconductor field-effect-transistors may correspond to one critical dimension for a semiconductor device having such transistors.

As the integrated circuit devices become smaller, so do the semiconductor critical dimensions for transistors, interconnect, or other features. The semiconductor critical dimensions have become so small that even very small offsets can represent a significant percentage of the semiconductor features resulting in a potentially large error.

Overlay errors including alignment and focus can affect these semiconductor features. In the case of multiple exposures, the critical dimensions can also be affecting by overlay errors. For example, during double exposure, the illumination energy dose can be reduced to approximately half and a misalignment or focus error can cause unintended or missing features.

Multiple exposure using customize illumination is one of the current resolution enhancement technique. Assist feature are placed in the orientation of the customized illumination. However, with double exposure, the energy dose per photomask exposure is half. The junctions, where the assist features intersect, are printed as a resist pillar on wafer. Reducing the size of the assist feature may affect the mask-making yield.

Despite the advantages of recent developments in integrated circuit fabrication there is a continuing need for improving manufacturing control, integrated circuit performance, photomask yield, and integrated circuit yield.

Thus, a need still remains for an integrated circuit system to provide improved control of manufacturing processes including photomasks. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate; forming a main feature using a first non-cross-junction assist feature over the substrate; forming the main feature using a second non-cross-junction assist feature, adjacent a location of the first non-cross-junction feature, over the substrate; and forming an integrated circuit having the substrate with the main feature thereover.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
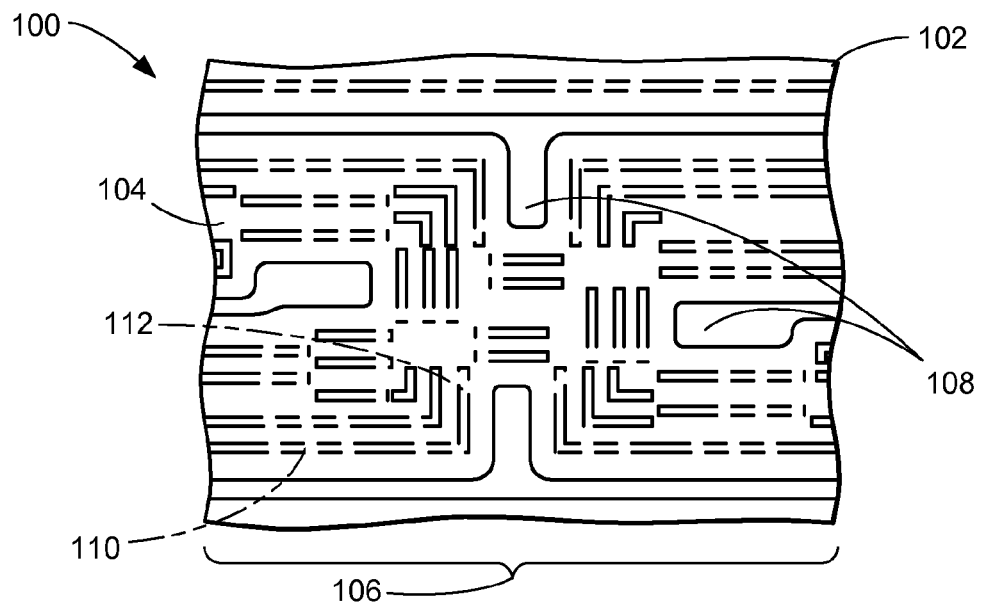
FIG. 1 is a top plan view of an integrated circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on" "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a top plan view of an integrated circuit system 100 in an embodiment of the present invention. The integrated circuit system 100 preferably includes an integrated circuit wafer 102 having an integrated circuit substrate 104. The integrated circuit substrate 104 includes an integrated circuit die 106 having main integrated circuit features 108 such as semiconductors.

The main integrated circuit features 108 such as metal, polysilicon, dopant implants, or via semiconductors can be formed over the integrated circuit substrate 104. The integrated circuit die 106 having the main integrated circuit features 108 can provide connectivity for electrical levels or electrical signals.

A first image of non-cross-junction assist features 110 and a second image of non-cross-junction assist features 112 are shown for reference with phantom lines. The first image of non-cross-junction assist features 110 and the second image of non-cross-junction assist features 112 are not printed on the integrated circuit substrate 104 and can be formed in a shape of an L having substantially no overlap and substantially eliminating cross-junctions.

The cross-junctions can be formed wherein an assist feature crosses another of the assist feature can form regions of unintended resist such as resist pillars. The unintended resist can result in forming unintended features over the integrated circuit substrate 104. The unintended features can result in defects or failure of the integrated circuit die 106 due in part to shorts or opens.

Forming the first image of non-cross-junction assist features 110 and the second image of non-cross-junction assist features 112 also provides improved placement of the main integrated circuit features 108. For example, there were no missing features for a best focus with no offset as well as a defocus of negative fifteen hundredths of a micron (−0.15 um).

It has been discovered that the integrated circuit system 100 substantially eliminates resist pillar formations thereby eliminating unintended features or additional cleaning as well as substantially eliminates the need for reducing sizes of the assist features thereby improving photomask and integrated circuit yield.

Figure 2:
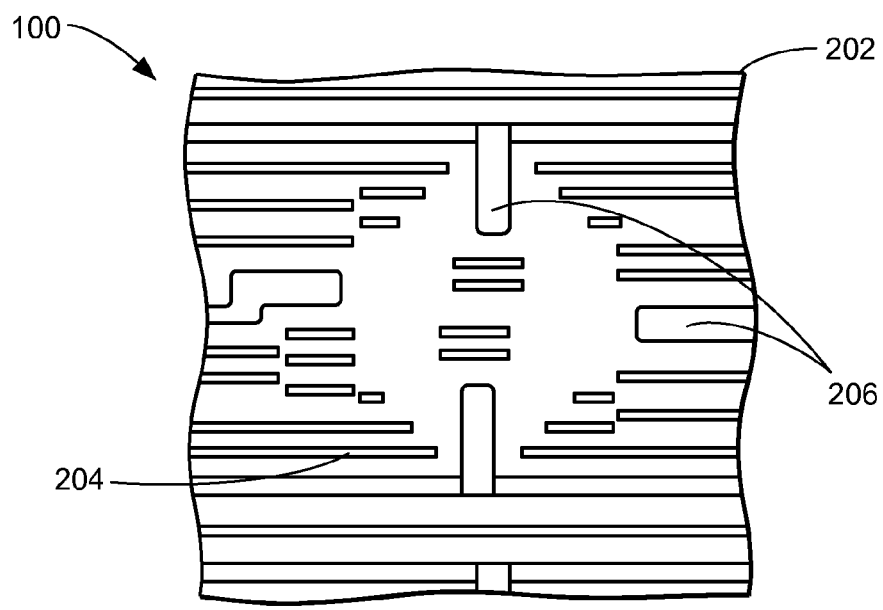
FIG. 2 is a top plan view of the integrated circuit system in a first mask phase.

Referring now to FIG. 2 therein is shown a top plan view of the integrated circuit system 100 in a first mask phase. The integrated circuit system 100 preferably includes a first photomask 202, a first portion of non-cross-junction assist features 204, and main features 206. The first portion of non-cross-junction assist features 204 and the main features 206 can be formed over the first photomask 202.

The first photomask 202 can be formed of a transparent material, such as a quartz material, a polycarbonate material, a pyrex material, a calcium fluoride ($CaF_2$) material, a magnesium fluoride material ($MgF_2$), or any other similar type of material that is transparent to light. The first photomask 202 can formed of a transparent material allowing illumination to pass through the first photomask 202 and over the integrated circuit substrate 104 of FIG. 1.

The first portion of non-cross-junction assist features 204 can be formed of opaque materials such as tungsten (W), tungsten silicide (WSi), tungsten silicon nitride (WSiN), tungsten alloys, tantalum (Ta), tantalum silicide (TaSi), tantalum silicon nitride (TaSiN), tantalum alloys, titanium (Ti), titanium alloys, molybdenum (Mo), molybdenum silicide (MoSi), molybdenum alloys, gold (Au), chrome (Cr), or combination thereof.

For example, the first portion of non-cross-junction assist features 204 can be formed as a horizontal shape adjacent the main features 206 over the first photomask 202 for improved alignment of the first photomask 202 over the integrated circuit substrate 104 of FIG. 1. The first photomask 202 can be aligned to other features, other photomasks, or combination thereof for connectivity of the integrated circuit die 106 of FIG. 1.

The first portion of non-cross-junction assist features 204 can be in a shape of the first image of non-cross-junction assist features 110 of FIG. 1 with a different size scale. Similarly, the main features 206 can be in a shape of the main integrated circuit features 108 of FIG. 1 with the different size scale. The first portion of non-cross-junction assist features 204 and the main features 206 can be formed with the different size scale over the first photomask 202.

Figure 3:
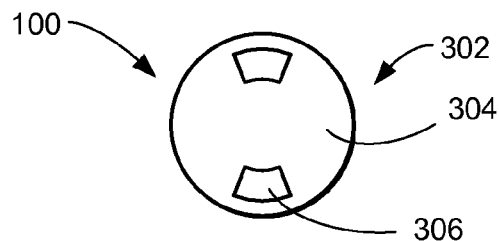
FIG. 3 is a top view of a first illumination source of the integrated circuit system in the first mask phase.

Referring now to FIG. 3, therein is shown a top view of a first illumination source 302 of the integrated circuit system 100 in the first mask phase. The first illumination source 302 such as a light source can preferably include a lens 304 for transmitting illumination over the integrated circuit substrate 104 of FIG. 1. The lens 304 can also include apertures 306 for providing custom illumination over the integrated circuit substrate 104.

The first illumination source 302 can provide exposure of a photoresist (not shown) formed over the integrated circuit substrate 104. Exposure by the first illumination source 302 can provide portions of the photoresist resistant to removal. A process such as a wash can remove exposed portions of the positive type photoresist thereby exposing a region over the integrated circuit substrate 104 or other features formed over the integrated circuit substrate 104.

For example in a clear field mask, the first photomask 202 of FIG. 2 can block illumination of the main features 206 of FIG. 2 and the first portion of non-cross-junction assist features 204 of FIG. 2 can block illumination. Alternatively, in a dark field mask, the first photomask 202 can provide illumination of the main features 206 and the first portion of non-cross-junction assist features 204.

For illustrative purposes, the first illumination source 302 is shown having two of the apertures 306 in the lens 304 with a shape of a circle although it is understood the apertures and lens may be of a different shape, position, or size.

Figure 4:
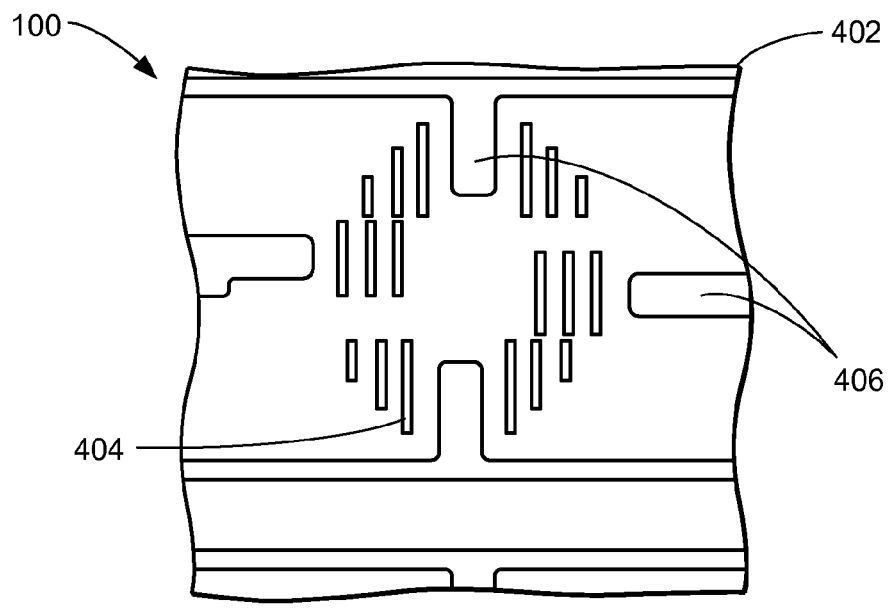
FIG. 4 is a top plan view of the integrated circuit system in a second mask phase.

Referring now to FIG. 4, therein is shown a top plan view of the integrated circuit system 100 in a second mask phase. The integrated circuit system 100 preferably includes a second photomask 402, a second portion of non-cross-junction assist features 404, and main features 406. The second portion of non-cross-junction assist features 404 and the main features 406 can be formed over the second photomask 402.

The second photomask 402 can be formed of a transparent material, such as a quartz material, a polycarbonate material, a pyrex material, a calcium fluoride (CaF.sub.2) material, a magnesium fluoride material (MgF.sub.2), or any other similar type of material that is transparent to light. The second photomask 402 can formed of a transparent material allowing illumination to pass through the second photomask 402 and over the integrated circuit substrate 104 of FIG. 1.

The second portion of non-cross-junction assist features 404 can be formed of opaque materials such as tungsten (W), tungsten silicide (WSi), tungsten silicon nitride (WSiN), tungsten alloys, tantalum (Ta), tantalum silicide (TaSi), tantalum silicon nitride (TaSiN), tantalum alloys, titanium (Ti), titanium alloys, molybdenum (Mo), molybdenum silicide (MoSi), molybdenum alloys, gold (Au), chrome (Cr), or combination thereof.

For example, the second portion of non-cross-junction assist features 404 can be formed as a vertical shape adjacent the main features 406 over the second photomask 402 for improved alignment of the second photomask 402 over the integrated circuit substrate 104 of FIG. 1. The second photomask 402 can be aligned to other features, other photomasks, or combination thereof for connectivity of the integrated circuit die 106 of FIG. 1.

The second portion of non-cross-junction assist features 404 can be in a shape of the second image of non-cross-junction assist features 112 of FIG. 1 with a different size scale. Similarly, the main features 406 can be in a shape of the main integrated circuit features 108 of FIG. 1 with the different size scale. The second portion of non-cross-junction assist features 404 and the main features 406 can be formed with the different size scale over the second photomask 402.

Figure 5:
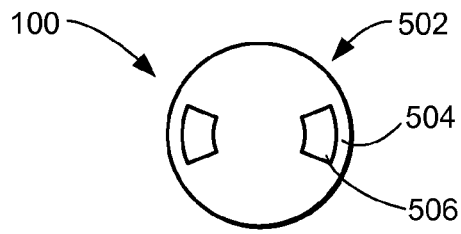
FIG. 5 is a top view of a second illumination source of the integrated circuit system in the second mask phase.

Referring now to FIG. 5, therein is shown a top view of a second illumination source 502 of the integrated circuit system 100 in the second mask phase. The second illumination source 502 such as a light source can preferably include a lens 504 for transmitting illumination over the integrated circuit substrate 104 of FIG. 1. The lens 504 can also include apertures 506 for providing custom illumination over the integrated circuit substrate 104.

The second illumination source 502 can provide exposure of a photoresist (not shown) formed over the integrated circuit substrate 104. Exposure by the second illumination source 502 can provide portions of the photoresist resistant to removal. A process such as a wash can remove exposed portions of the positive type photoresist thereby exposing a region over the integrated circuit substrate 104 or other features formed over the integrated circuit substrate 104.

For example in a clear field mask, the second photomask 402 of FIG. 4 can block illumination of the main features 406 of FIG. 4 and the second portion of non-cross-junction assist features 404 of FIG. 4 can block illumination. Alternatively, in a dark field mask, the second photomask 402 can provide illumination of the main features 406 and the second portion of non-cross-junction assist features 404.

For illustrative purposes, the second illumination source 502 is shown having two of the apertures 506 in the lens 504 with a shape of a circle although it is understood the apertures and lens may be of a different shape, position, or size.

Figure 6:
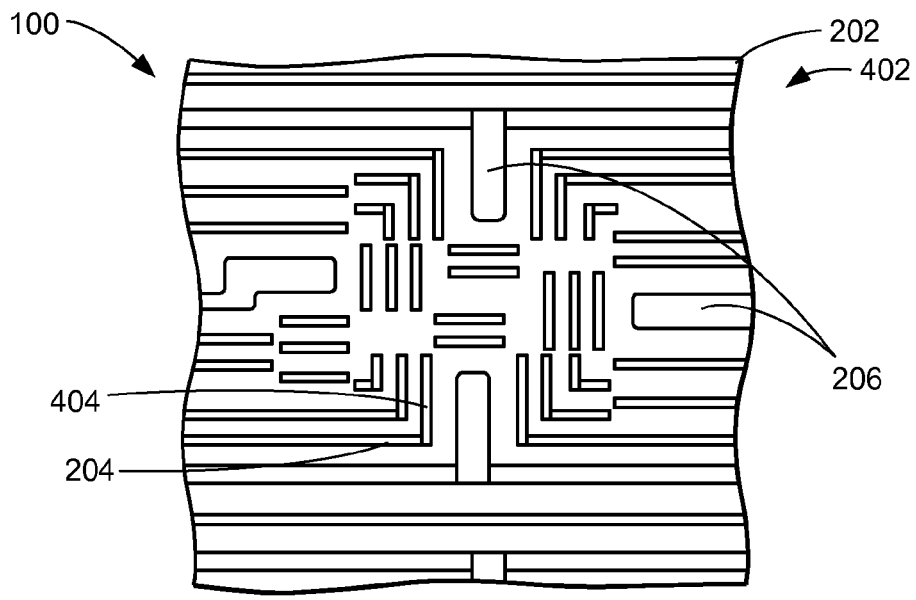
FIG. 6 is a top plan view of the first photomask over the second photomask of the integrated circuit system.

Referring now to FIG. 6, therein is shown a top plan view of the first photomask 202 over the second photomask 402 of the integrated circuit system 100. The first photomask 202 and the second photomask 402 can preferably be applied individually with an exposure process such as dipole or other customized illumination. Placing the first photomask 202 over the second photomask 402 illustrates positioning of the first portion of non-cross-junction assist features 204 and the second portion of non-cross-junction assist features 404 in a shape of an L without cross-junctions.

The first portion of non-cross-junction assist features 204 and the second portion of non-cross-junction assist features 404 can be formed having substantially no overlap and substantially eliminating cross-junctions. Assist features with cross-junctions can have cross-junctions identified and removed forming L-shaped features having the first portion of non-cross-junction assist features 204 and the second portion of non-cross-junction assist features 404.

The first portion of non-cross-junction assist features 204 can be formed by standard optical or e-beam patterning techniques over the first photomask 202. Similarly, the second portion of non-cross-junction assist features 404 can be formed by standard optical or e-beam patterning techniques over the second photomask 402 respectively For illustrative purposes, the first photomask 202 is shown over the second photomask 402 although it is understood that the first photomask 202 and the second photomask 402 may be used separately or individually.

Figure 7:
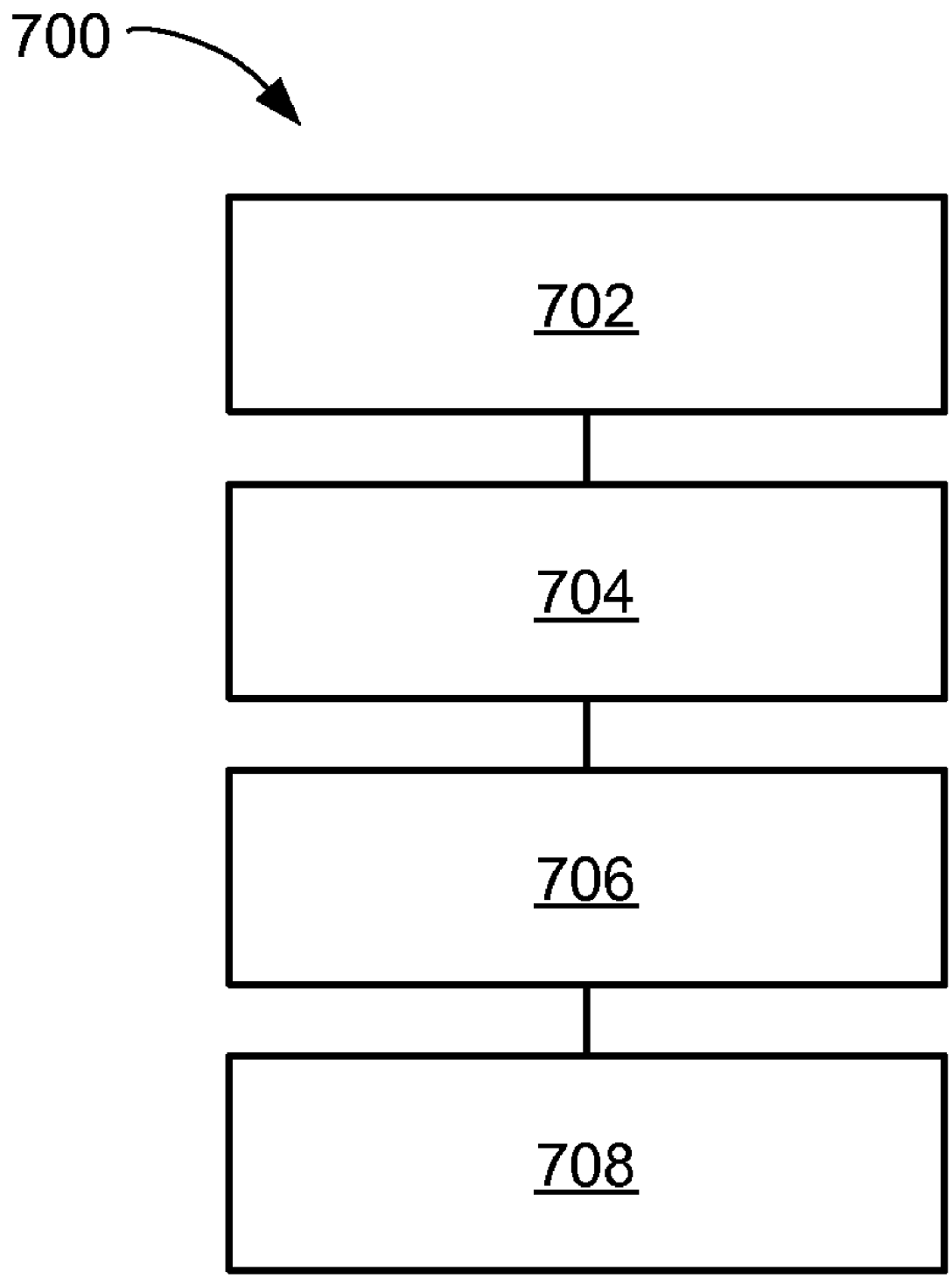
FIG. 7 is a flow chart of an integrated circuit system for manufacturing the integrated circuit system in an embodiment of the present invention.

Referring now to FIG. 7, therein is shown a flow chart of an integrated circuit system 700 for manufacturing the integrated circuit system 100 in an embodiment of the present invention. The system 700 includes providing a substrate in a block 702; forming a main feature using a first non-cross-junction assist feature over the substrate in a block 704; forming the main feature using a second non-cross-junction assist feature, adjacent a location of the first non-cross-junction feature, over the substrate in a block 706; and forming an integrated circuit having the substrate with the main feature thereover in a block 708.

In greater detail, a system to provide the method and apparatus of the integrated circuit system 100, in an embodiment of the present invention, is performed as follows:

1. Providing an integrated circuit substrate.
2. Exposing a main integrated circuit feature using a first non-cross-junction assist feature over the substrate.
3. Exposing the main integrated circuit feature using a second non-cross-junction feature, adjacent a location of the first non-cross-junction feature assist, over the substrate.
4. Forming an integrated circuit die having the integrated circuit substrate with the main integrated circuit feature thereon.

Thus, it has been discovered that the integrated circuit system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
   providing a substrate;
   forming a main feature aligned with a first non-cross-junction assist feature over the substrate;
   forming the main feature aligned with a second non-cross-junction assist feature, adjacent a location of the first non-cross-junction feature, over the substrate; and
   forming an integrated circuit having the substrate with the main feature thereover.

2. The method as claimed in claim 1 further comprising forming a first photomask having the main feature and the first non-cross-junction assist feature.

3. The method as claimed in claim 1 further comprising forming a second photomask having the main feature and the second non-cross-junction assist feature.

4. The method as claimed in claim 1 wherein forming the main feature with the first non-cross-junction assist feature includes exposing a region over the substrate through a first photomask.

5. The method as claimed in claim 1 wherein forming the main feature with the second non-cross-junction assist feature includes exposing a region over the substrate through a second photomask.

6. A method for manufacturing an integrated circuit system comprising:
   providing an integrated circuit substrate;
   forming a main integrated circuit feature using a first image of non-cross-junction assist features over the integrated circuit substrate;
   forming the main integrated circuit feature using a second image of non-cross-junction features, adjacent a location of the first image of non-cross-junction assist features, over the integrated circuit substrate; and
   forming an integrated circuit die having the integrated circuit substrate with the main integrated circuit feature thereover.

7. The method as claimed in claim 6 further comprising forming a first photomask eliminating a cross-junction of a first portion of non-cross-junction assist features and a second portion of non-cross-junction assist features.

8. The method as claimed in claim 6 further comprising forming a second photomask eliminating a cross-junction of a second portion of non-cross-junction assist features and a first portion of non-cross-junction assist features.

9. The method as claimed in claim 6 wherein forming the main feature includes customizing a first illumination source over the integrated circuit substrate through a first photomask.

10. The method as claimed in claim 6 wherein forming the main feature includes customizing a second illumination source over the integrated circuit substrate through a second photomask.

11. An integrated circuit system comprising:
    a substrate;
    a main feature aligned with a first non-cross-junction assist feature over the substrate and a second non-cross-junction assist feature over the substrate adjacent the first non-cross-junction feature; and
    an integrated circuit having the substrate with the main feature thereover.

12. The system as claimed in claim 11 further comprising a first photomask having the main feature and the first non-cross-junction assist feature.

13. The system as claimed in claim 11 further comprising a second photomask having the main feature and the second non-cross-junction assist feature.

14. The system as claimed in claim 11 wherein the main feature aligned with the first non-cross-junction assist feature includes an exposed region over the substrate.

15. The system as claimed in claim 11 wherein the main feature aligned with the second non-cross-junction assist feature includes an exposed region over the substrate.

16. The system as claimed in claim 11 wherein:
    the substrate is an integrated circuit substrate;
    the main feature is a main integrated circuit feature aligned with a first image of non-cross-junction assist features over the integrated circuit substrate and a second image of non-cross-junction assist features adjacent the first image of non-cross-junction features over the integrated circuit substrate; and
    the integrated circuit is an integrated circuit die having the integrated circuit substrate with the main integrated circuit feature thereover.

17. The system as claimed in claim 16 further comprising a first photomask eliminating a cross-junction of a first portion of non-cross-junction assist features and a second portion of non-cross-junction assist features.

18. The system as claimed in claim 16 further comprising a second photomask eliminating a cross-junction of a second portion of non-cross-junction assist features and a first portion of non-cross-junction assist features.

19. The system as claimed in claim 16 wherein the main integrated circuit feature is formed by a first illumination source customized over the integrated circuit substrate through a first photomask.

20. The system as claimed in claim 16 wherein the main integrated circuit feature is formed by a second illumination source customized over the integrated circuit substrate through a second photomask.

* * * * *